(12) United States Patent
Lee

(10) Patent No.: US 6,260,170 B1
(45) Date of Patent: Jul. 10, 2001

(54) METHOD FOR CONTROLLING MEMORY AND DIGITAL RECORDING/REPRODUCING DEVICE USING THE SAME

(75) Inventor: Je Hyoung Lee, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 09/141,606

(22) Filed: Aug. 28, 1998

(30) Foreign Application Priority Data

Aug. 29, 1997 (KR) .................................................. 97-42889

(51) Int. Cl.$^7$ ............................... G11C 29/00; G11B 5/09
(52) U.S. Cl. ........................... 714/769; 714/775; 360/48; 360/53; 386/124
(58) Field of Search ........................................ 714/755, 758, 714/769, 775; 360/48, 53, 32; 386/40, 98, 116, 124

(56) References Cited

U.S. PATENT DOCUMENTS

| | | | |
|---|---|---|---|
| 5,473,479 | * | 12/1995 | Takakura ................................ 360/48 |
| 5,532,831 | * | 7/1996 | Choi et al. ............................ 358/335 |
| 5,587,789 | * | 12/1996 | Lee et al. ................................ 386/68 |
| 5,856,890 | * | 1/1999 | Hamai et al. ........................... 360/53 |
| 5,991,501 | * | 11/1999 | Higurashi et al. ...................... 386/98 |

* cited by examiner

*Primary Examiner*—Emmanuel L. Moise

(57) ABSTRACT

A method and apparatus for controlling a memory to record data received at random rate into a fixed rate and to reproduce the data recorded in a fixed rate includes a shuffle memory with a plurality of memory banks for recording and reproducing a digital data at a fixed rate and the smoothing memory is also allocated to a surplus region of the shuffle memory. By using a serial clock and a plurality of FIFOs, the data can be efficiently recorded and reproduced without collision.

30 Claims, 9 Drawing Sheets

(a) 
transport packets (b) 
selected packets (c) 
transmitted packets (d) 
Ref.clock(PCR PLL)

(e) 
record time stamps
TIME STAMP (f) 
record bitstream (g) 
reproduction bitstream (h) 
Ref.clock(X'tal)

(i)

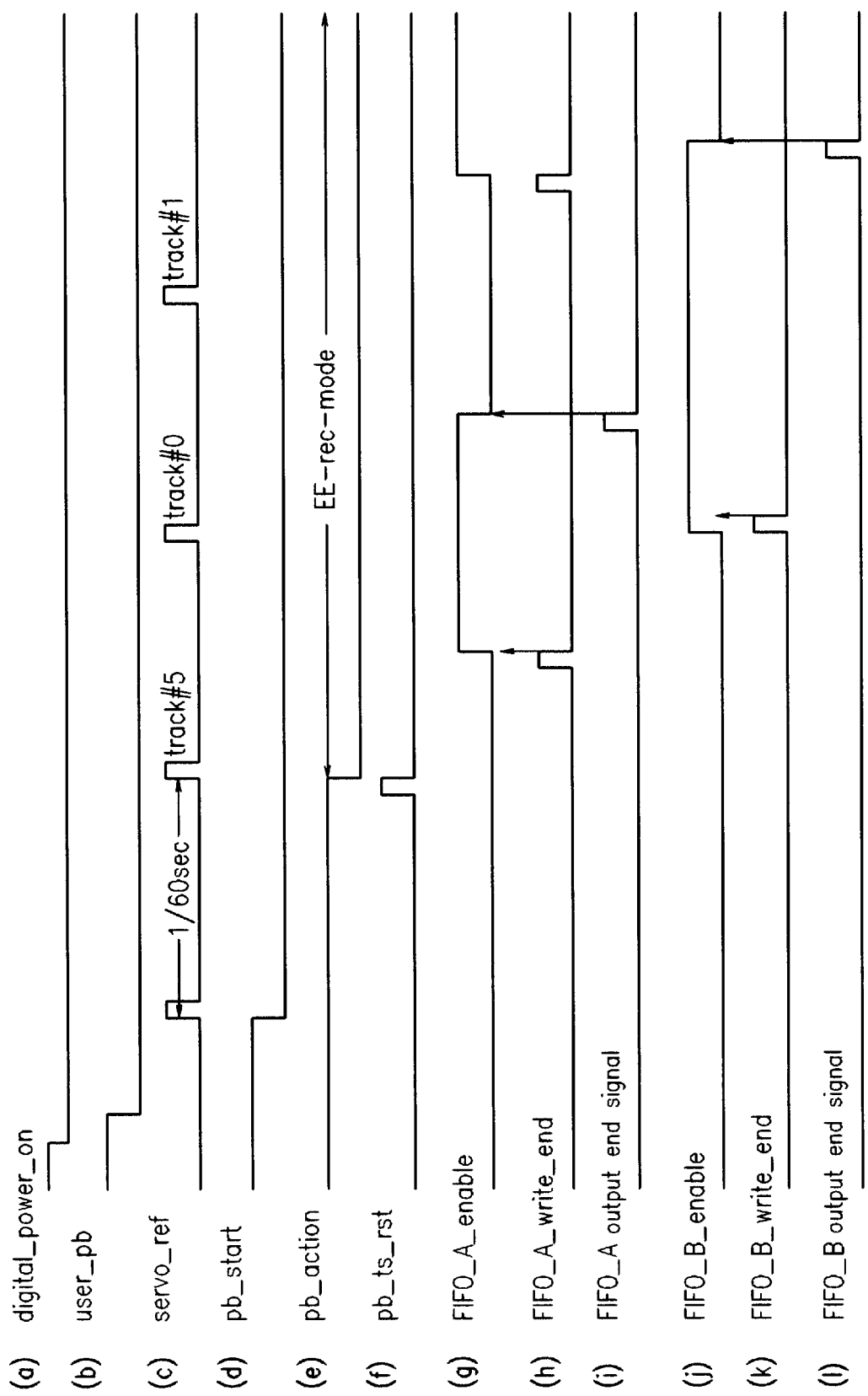

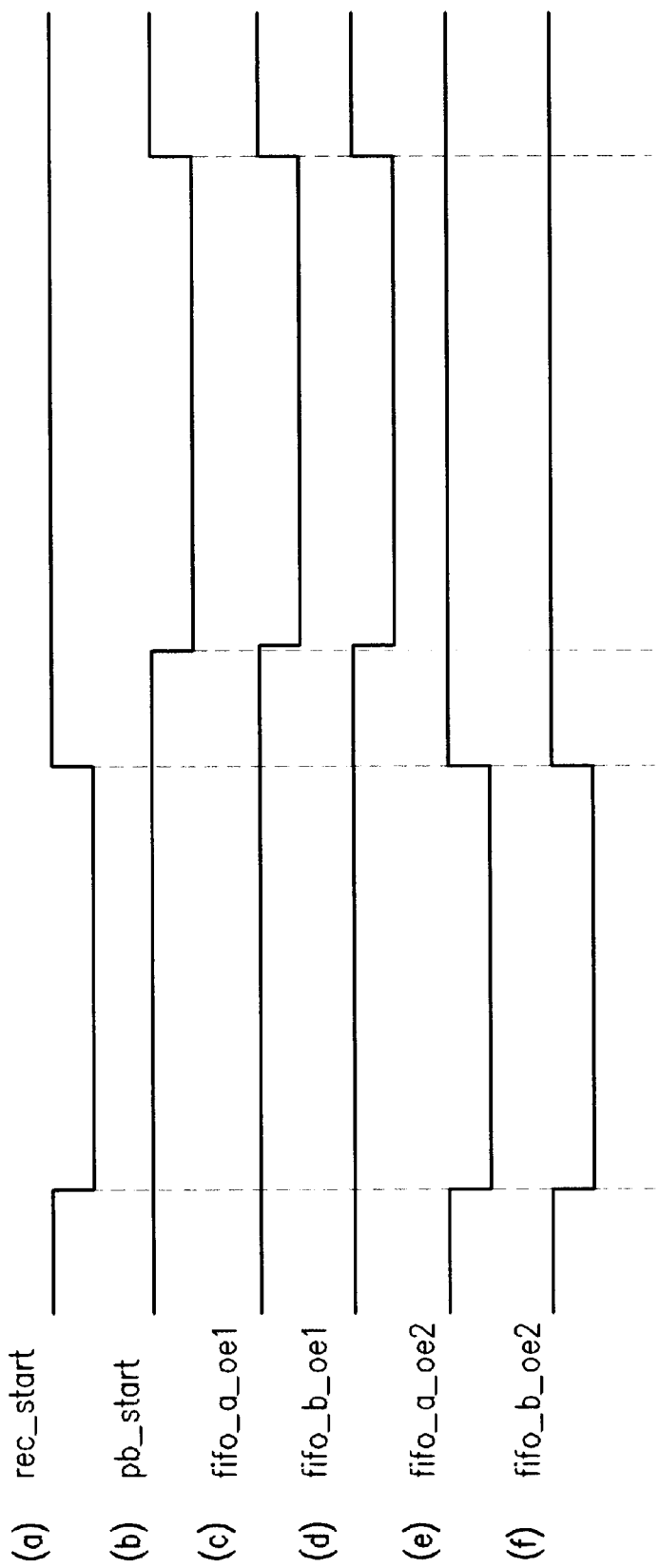

METHOD FOR CONTROLLING MEMORY AND DIGITAL RECORDING/REPRODUCING DEVICE USING THE SAME

BACKGROUND OF THE INVENTION

1. Field of the Invention

The present invention relates to recording and reproducing digital data, and more particularly to a method and apparatus for converting data received in a random rate to a fixed rate.

2. Discussion of the Related Art

Digital broadcastings by which programs are transmitted in digital signals using digital compression technologies, have been in, or will be put into commercial use in the U.S.A., Europe, and Asia in the forms of satellite broadcastings, cable broadcastings, and terrestrial broadcastings. Because the digital broadcasting provides entertainment as well as a variety of multimedia services, the digital broadcasting receives close attention as the broadcasting method of the next veneration.

Following this trend, demands on the commercial production of Digital Video Cassette Recorder (DVCR) which records/reproduces a digital broadcasting program in a digital signal are also increased. However, the standard for a DVCR is a VCR format which receives a program selected by an external digital TV in an MPEG 2 transport packet data, and merely records the bitstream before reproducing the bitstream. Thus, an interface is required for a data transmission between a digital VCR of the DVCR standard and a digital TV. In the data of the aforementioned MPEG 2 transport packet data, a control command between the two devices are time-division multiplexed. Moreover, the DVCR records/reproduces the data at a fixed rate to maintain stabilization of the system.

Although the MPEG2 transport packet data of a program selected by a digital TV is recorded at a fixed rate, the data may be received in burst, in a variable rate like the Echostar satellite broadcasting of the U.S.A. A broadcasting data is transmitted at a variable transmission rate depending on a program characteristic. For efficient use of a channel, motions or sports require a real time compression and are transmitted at a rate of approximately 6 Mbps, while dramas with less motion can be greatly compressed and are transmitted at a lower rate of approximately 4 Mbps. Accordingly, a smoothing buffer is required to convert the data received in a variable rate into a fixed rate. On the other hand, a desmoothing buffer is required to reproduce the burst of time intervals to satisfy an MPEG 2 time jitter limitation. Thus, a smoothing buffer is used in the recording stage and a desmoothing buffer is used in the reproduction stage. A size of the buffer is determined by the maximum recordable variable bit rate.

FIG. 1 illustrates a block diagram of a digital TV and a DVCR in the related art, wherein a tuner 12 in a digital TV 10 selects one channel from a plurality of channels received through an antenna 11 and demodulates the received signal; and a de-MUX/program selector 13 selects one desired program from a plurality of programs included in the channel. If a viewer selects a particular program for viewing, the selected program is output to the MPEG decoder 14 wherein the video and audio of the selected program is restored. If a recording is desired, the selected program is output as an MPEG transport packet to a digital interfacer D-IF 21 in the DVCR 20 through the digital interfacer D-IF 15.

As shown in FIG. 2(a), the transport packets of the channel tuned by the tuner 12 are mixed with the transport packets of various other programs. Thus, when the de-Mux/program selector 13 selects one program, only the transport packets of the selected program is selected as shown in FIG. 2(b). Accordingly, only the selected packets as shown in FIG. 2(c) are output to the MPEG decoder 14 or the D-IF.

The DVCR further includes a time stamp generator 22 counting the point of time upon receiving the MPEG 2 transport packets through the D-IF 21 with respect to a reference clock (i.e., 27 MHz clock) as shown in FIG. 2d, and generating time stamps as shown in FIG. 2(e); a smooth buffer 23 storing the MPEG 2 transport packet data received through the D-IF 21 together with the time stamp signal generated in the time stamp generator 22. A memory controller 24 controls the reading/writing timings of the shuffle memory 25 and reads the data from the smooth buffer 23 to store the read data in the shuffle memory 25 as shown in FIG. 2(f).

Also shown in FIG. 2(f), a null data is inserted if there is no data from the digital TV while the memory controller 24 generates a read signal. By inserting a null data, the transport packets are recorded at a fixed rate as shown in FIG. 2(c), even if the transport packets are not received at a fixed rate.

The time stamp signal is stored in the shuffle memory 25 together with the transport packets because the amount of transport packets received by the smooth buffer 23 may be greater than the amount of transport packet read from the smooth buffer 23 by the memory controller 24. When the transport packets are stored in the shuffle memory 25, the difference in the amount of transport packets can shift the time frame by which the packets are stored. Thus, storing both the time stamp signal and the transport packets prevents a time shift in storing the transport packets in the shuffle memory. Moreover, the dual storage also satisfies the timing jitter at the reproduction.

The data stored in the shuffle memory 25 contains an outer code word and an inner code word which are processed for an error coding correction (ECC). Particularly, the outer code word is first inputted to an ECC 26 through the memory controller 24 and stored back in the shuffle memory 25 after being incorporated into the ECC timing. Similarly, the inner code is then inputted to the ECC 26 and stored back in the shuffle memory 25 after being incorporated into the ECC timing. The fully incorporated outer and inner codes are read again from the shuffle memory 25 through the memory controller 24 and output to a synchronization/ID adder 27 wherein a synchronization (sync) signal and an ID are added to the codes. From the sync/ID adder 27, the codes are arranged into a synchronous block of a DVCR recording format and output to a Non-Return-to Zero (NRZI) 28. The NRZI 28 is a demodulator adapted to invert the data with a '1' signal and inverts the status of any data with a '1' signal. An NRZI modulated signal is amplified by a recording amplifier 29 and recorded on a tape 30.

The data input/output between the smooth buffer 23 and the shuffle memory 25 will be explained in detail with reference to FIG. 3. The shuffle memory 25 has a bank0 and a bank1, each bank functioning alternatively as a part of one block for ECC. When the bank0 is under an inner error correction, the bank1 is under an outer error correction, and vice versa. Specifically, the outer code word 'c' stored in the shuffle memory 25 is output to an outer ECC 26-2 within the ECC 26 for an outer error correction. Once the outer code is incorporated in the ECC 26-2, the incorporated data 'd' is output and stored back in an appropriate location of the shuffle memory 25 under the control of the memory controller 24.

Upon completion of the outer error correction, the inner code word 'e' is output to an inner ECC 26-1 within the ECC 26 for an inner ECC. However, since the inner code word 'e' is output to the inner ECC 26-1 after the completion of the outer ECC, when the inner code is incorporated in the ECC 26-1, the incorporated data 'f' is ready to be recorded on a tape. Thus, it is unnecessary to store the data 'f' back in the shuffle memory 25. Accordingly, under the control of the memory controller 24, the data output by the smooth buffer 23 is stored in the region of the shuffle memory 25 from which the inner code word had been output.

For example, as shown in FIG. 3, when the bank1 carries out the outer ECC, the bank0 carries out the inner ECC. When the bank0 outputs an inner code word 'e' to the inner ECC, a data 'b' from the smooth buffer 23 is stored in the location from which the inner code word has been output. Once the inner code word is output to the ECC 26-2, the bank0 stores only a null data together with the data from the smooth buffer 23. Hence, the bank0 outputs the outer code of the data received from the smooth buffer 23 to the ECC 26-2 for outer ECC and stores back the outer code incorporated data in the appropriate memory location. Similarly, when the bank1 carries out the inner ECC after the completion of the outer ECC, the data from the smooth buffer 23 is stored in bank1 into the location from which the inner code word has been output. Because the inner ECC 'e', the storage of the data 'b' from the smooth buffer 23, and the outer ECC 'c' and 'd' are successively processed by the shuffle memory 25 within a time period of T, as shown in FIG. 4, a parallel clock is adequate.

The discussion thus far has been the recording of the data, but the reproduction process is carried out according to a process opposite to the aforementioned recording process. The signal reproduced from the tape 30 is amplified in the amplifier 31, decoded in an INRZI 32, and the sync signal and ID is detected by a sync/ID detector 33. The synchronous blocks detected by an sync/ID detector 33 is stored in the shuffle memory 36 through an memory controller 35; processed for an inner an outer ECC through an ECC 34; and timely output through a memory controller 35 to a desmooth buffer 37 and to a time stamp generator 38, as shown in FIG. 2(g).

The time stamp generator 38 separates the time stamp signals from the received data for a comparison with respect to a reproduction reference clock (i.e. 27 Mhz) as shown in FIG. 2(h). By the comparison, the transport packets are detected at the exact time points within the data from the desmooth buffer 37, as shown in FIG. 2(j). The detected transport packets are output to the digital TV through the D-IF 21. During the reproduction process, the null data inserted in the recording process is removed by skipping the data. Thus, the MPEG 2 transport packets are received/forwarded with the same timing in the recording/reproduction, thereby satisfying the limitation on the MPEG 2 timing jitter.

As discussed above, the size of the buffer is determined by the maximum recordable variable bit rate. Particularly, a theoretical size of a buffer for the smoothing and desmoothing process can be calculated as follows.

Assuming that no overflow occurs from a buffer with reference to one track, and if one track time (Top)=1/60 sec, a recording rate (Rrec)=13.80 bps, an input rate (Rtransmit)=30 Mbps, a maximum relative delay Td can be expressed and calculated with equation (1) below.

$$Td = Top\left(1 - \frac{Rrec}{Rtransmit}\right) = 8.99 \text{ ms} \quad (1)$$

Also, a minimum smoothing buffer size Bsmooth can be expressed and calculated with the following equation (2).

$$Bsmooth = (Top - Td) \times (Rtransmit - Rrec) \quad (2)$$
$$= (16.67 - 8.99) \text{ ms} \times \{(30 - 13.80) \times 10E6\}/\{8 \times 188\}$$
$$= 81 \text{ TS packets.}$$

For 81 TS packets, a smoothing buffer size of approximately 15 Kbytes is required. By employing an exclusive buffer of the aforementioned size for smoothing and desmoothing, which is separate from the main storage memory (the shuffle memory), the related art has problems of high production costs and the instability in the system operation. Also, because the memory size is calculated with the minimal requirements, the size of the actual memory is often greater than the calculated maximum storage size. For example, if the main storage memory requires a maximum storage capacity of 2.1 Mbytes, a memory of 4 Mbytes must be selected, thereby severely wasting 1.9 Mbytes of memory.

SUMMARY OF THE INVENTION

Accordingly, an object of the present invention is to solve at least the problems and disadvantages of the related art.

Particularly, an object of the present invention is to provide a method and device for effectively controlling the memory storage.

Another object of the present invention is to provide an optimal sized smoothing/desmoothing buffer.

A further object of the present invention is to increase utilization of the shuffle memory.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

To achieve the objects and in accordance with the purposes of the invention, as embodied and broadly described herein, the method for controlling a memory during recording includes utilizing a portion of the shuffle memory as the smoothing memory. Thus, the shuffle memory contains a plurality of memory banks and a smoothing region. The memory banks alternates in the error code correction to efficiently process the received data.

In another embodiment of the present invention, a method for controlling a memory during reproduction includes utilizing a portion of the shuffle memory as the desmoothing memory. Thus, the shuffle memory contains a plurality of memory banks and a desmoothing region. The memory banks alternates in the error code correction to efficiently process the received data.

In another embodiment of the present invention, an apparatus for recording digital data includes an interfacer having a plurality of FIFOs; a shuffle memory having a plurality of memory banks and a smoothing buffer region allocated to a surplus region thereof; and a memory controller efficiently alternating the use of the memory banks in the error code correction.

In another embodiment of the present invention, an apparatus for reproduction of digital data includes an interfacer having a plurality of FIFOs; a shuffle memory having a plurality of memory banks and a desmoothing buffer region allocated to a surplus region thereof; and a memory controller efficiently alternating the use of the memory banks in the error code correction.

BRIEF DESCRIPTION OF THE DRAWINGS

The invention will be described in detail with reference to the following drawings in which like reference numerals refer to like elements wherein:

FIGS. 9a~9l illustrates a timing diagram of the control signals in the reproduction interfacer; and, FIGS. 10a~10f illustrates an operation timing diagram of the output ennoblement signals for driving the three buffers in FIG. 5.

DETAILED DESCRIPTION OF THE PREFERRED EMBODIMENT

Figure 5:
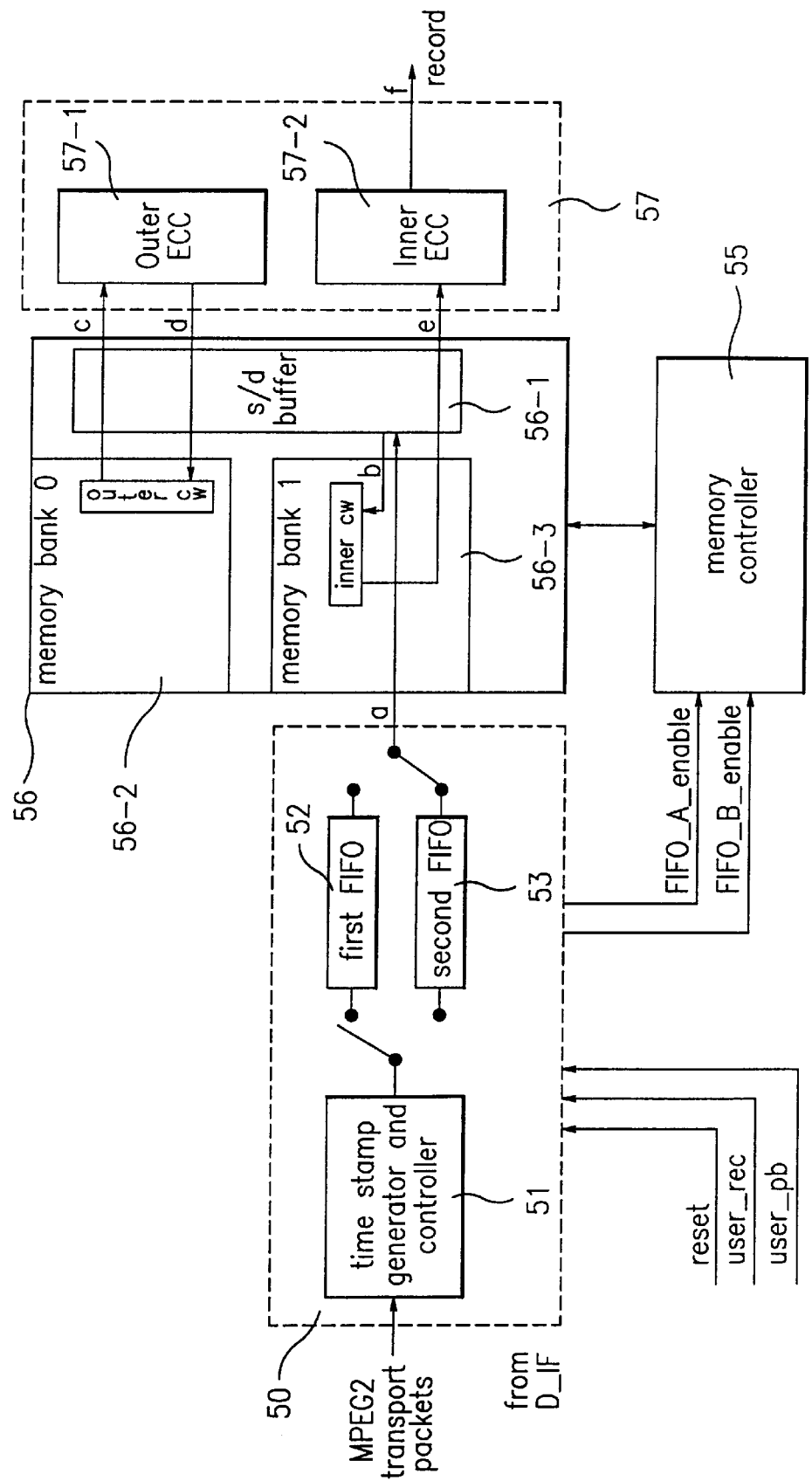
FIG. 5 illustrates a block diagram of a recording and reproducing device incorporating a preferred embodiment of the present invention.

Reference will now be made in detail to the preferred embodiments of the present invention, examples of which are illustrated in the accompanying drawings. FIG. 5 illustrates a part of a DVCR in accordance with a preferred embodiment of the present invention, including an interfacer 50; a shuffle memory 56 having a buffer region allocated thereon for a smoothing/desmoothing; a memory controller 55, and an ECC 57.

The interfacer 50 includes a time stamp generator and controller 51, a First Input First Output (FIFO) 52 and a second FIFO 53. Each of the FIFOs 52 and 53 must store 188 bytes of the MPEG 2 transport packets received through the D-IF 21 and 4 bytes of the time stamp generated from the time stamp generator and controller 51. Thus, the memory size necessary for each FIFOs 52 and 53 is 192 bytes, requiring an additional memory of approximately 512 bytes which is negligible compared to the 15 Kbytes required for the existing smooth buffer. Two FIFOs are used for the convenience of control, and with a required size of 512 bytes, only one FIFO would be adequate.

Before the recording of the MPEG 2 transport packets received through the digital TV 10, the system is initialized (initialization of all IC and FIFO) in response to a reset and user_rec signals from a system controller. After the initialization, the transport packets are received through the D-IF 21 and stored through the time stamp generator and controller 51 in either the first FIFO 52 or the second FIFO 53. The FIFOs also store the time stamp signals generated by the time stamp generator and controller 51. Because the data may be received in a burst, the FIFOs alternatively write and read the data to prevent data collision during input/output of data. the first FIFO. Thus, if one of the first FIFO 52 or second FIFO 53 is writing data, the other FIFO reads the stored data. To control the alternative writing and reading, a number of control signals such as a FIFO_A_enable, FIFO_B_enable, FIFO_A_read_end, and FIFO_B_read_end are used.

During an inactive state of the FIFO_A_enable signal, the interfacer 50 holds a right of access to the first FIFO 52 and may write the transport packets and the time stamps received through the D-IF 21 on the first FIFO 52. During an inactive state of the FIFO_B_enable signal, the interfacer 50 holds a right of access to the second FIFO 53 and may write the transport packets and the time stamps received through the D-IF 21 on the second FIFO 53. On the flip side, during an active state of the FIFO_A_enable signal, the shuffle memory 56 holds a right of access to the first FIFO 52 and may read the data recorded on the first FIFO 52. Likewise, during an active state of the FIFO_B_enable signal, the shuffle memory 56 holds a right to access to the second FIFO 53 and may read the data recorded on the second FIFO 53. When all data is read, the memory controller 55 informs the interfacer 50 the end of the reading through the FIFO_A_read_end and FIFO_B_read_end signals. Upon the activation of the FIFO_A_read_end signal, the FIFO_A_enable signal becomes inactive, and upon the activation of the FIFO_B_read_end signal, the FIFO_B_enable signal becomes inactive.

Figure 6:
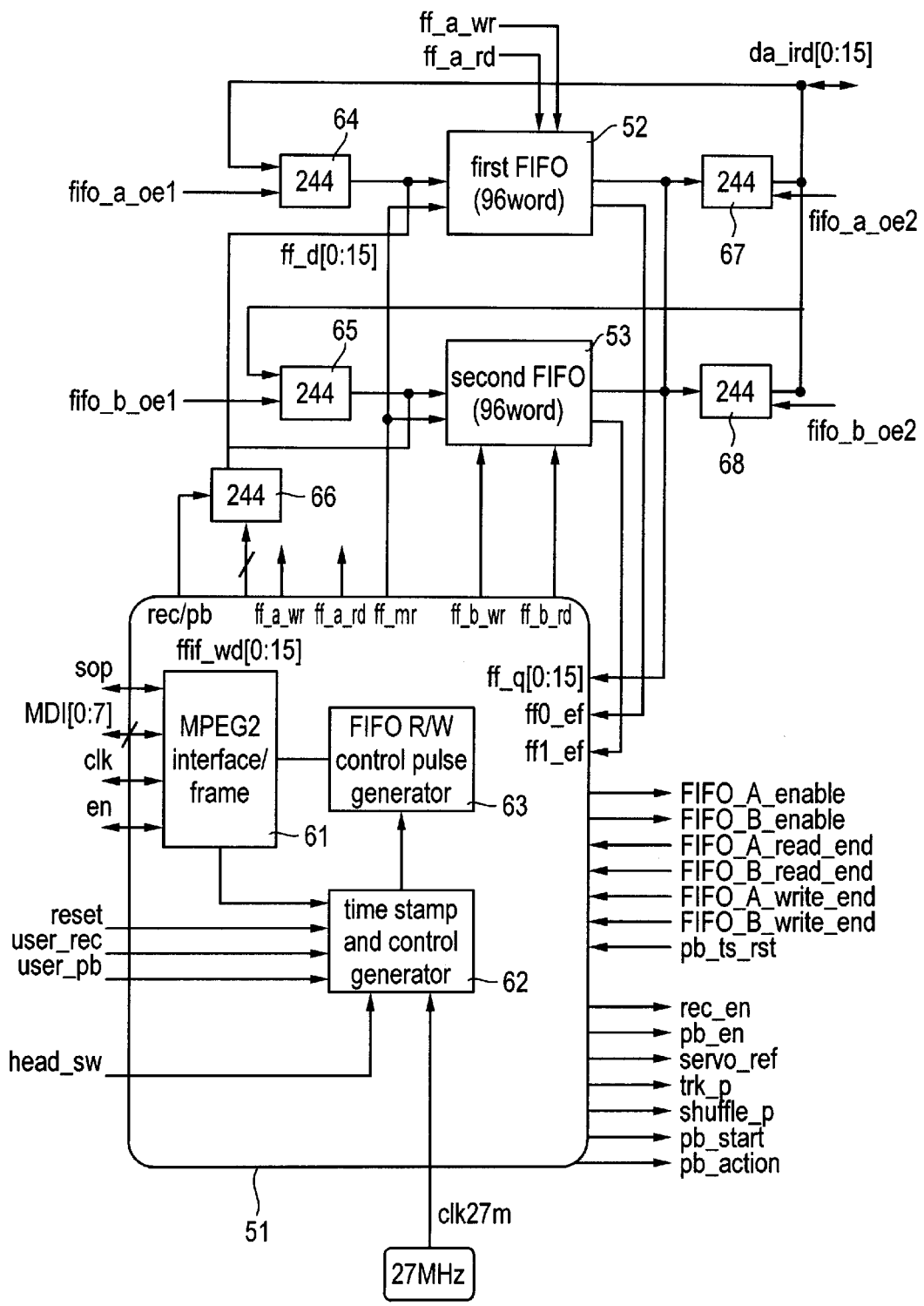
FIG. 6 illustrates a detailed block diagram of the interfacer in FIG. 5.

FIG. 6 illustrates a detailed block diagram of the interfacer 50, wherein the time stamp generator and controller 51 includes an MPEG2 interface/frame 61, a time stamp and control pulse generator 62, and an FIFO read/write (R/W) control pulse generator 63. A number of tri-state buffers allow the first and second FIFOs 52 and 52 to share the data buses on the input/output terminals. Specifically, the first FIFO 52 has buffers 64 and 67 connected to the input/output terminals; the second FIFO 53 has buffers 65 and 68 connected to the input/output terminals; and the time stamp generator and controller 51, the first FIFO 52 and the second FIFO 53 have a buffer 66 connected therebetween. Each of the buffers 64~68 may be a 74LS44, a tri-state bus driver operative as a transceiver when an output enable (oe) is active, when the output enable is inactive, and when an output terminal has a high impedance.

Figure 7:
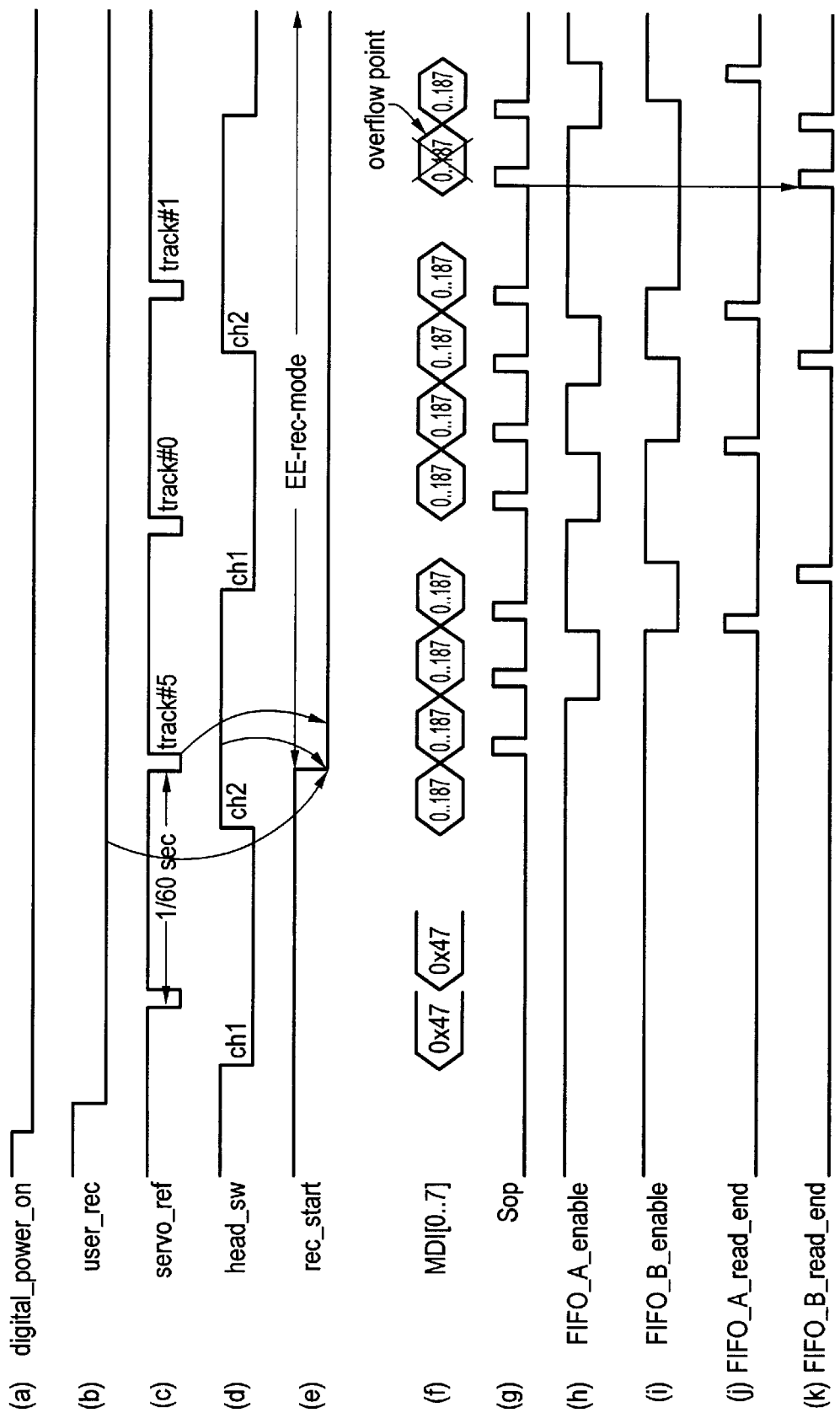
FIGS. 7a~7k illustrate a timing diagram of the control signals in the recording interfacer.

Referring to FIG. 7(a) when the power is on, if a control pulse generator (not shown) generates and outputs a servo reference (servo_ref) signal at ⅙₀ sec. intervals as shown in FIG. 7(c) to a syscon (not shown), the syscon generates a head switching (head_sw) pulse locked to the servo_ref signal as shown in FIG. 7(d), and the time stamp and control pulse generator 62 receives head_sw pulse. When a user selects recording, the time stamp and control pulse generator 62 initialize all ICs into a recording mode in response to a user_rec signal as shown in FIG. 7(b) and enables a record signal rec_en. After the enabling of the rec_en signal, a record starting signal rec_start is generated when the servo_ref signal and head_sw indicate the channel 2, i.e. an azimuth track, as shown in FIG. 7(e). The time stamp and control pulse generator 62 also generates a trk_p and shuffle_p signals. The trk_p signal is generated together with the servo_ref signal and the shuffle_p signal is generated at every 12 tracks. When the FIFO_A_enable signal shown in FIG. 7(h) or the FIFO_B_enable signal shown in FIG. 7(i) is brought into an inactive state by the time stamp and control pulse generator 62, only the interfacer 50 holds the right of access to the first, or second FIFO 52 or 53.

When the MPEG2 interface/frame 61 starts to receive the beginning signal of the transport packets sop (start of packet) and a data signal MDI[0:7] as shown in FIGS. 7(g) and 7(f), the time stamp and control pulse generator 62 generates a time stamp containing the packet arrival time information counted in 27 MHz in response to the sop signal. Being an MPEG2 transport stream, the data signal MDI[0:7] has packets, each packet with 188 byte length and a 4 byte packet header. The first byte of the packet header is a synchronous byte having the same value of 0×47 with all other packets.

As the time stamp generator and controller 51 in the interfacer 50 can access the first FIFO 52 when the FIFO_A_enable signal is inactive, a time stamp packet and data provided through the time stamp generator and controller 51 are written on the first FIFO 52. Upon the completion of the packet writing, the time stamp and control pulse generator 62 activates the FIFO_A_enable signal, allowing the shuffle memory 56 to initiate a reading process to read the data in the first FIFO 52. During this period, the tri-state buffer 66 is activated by a rec/pb signal and the tri-state buffer 67 is activated by an enable signal fifo_a_oe2. The tri-state buffers 64, 65, and 68 are inactive.

Accordingly, the time stamp and the data ff_wd[0:15] from the time stamp generator and controller 51 are written on the first FIFO 52 and output through the tri-state buffer 67. During the recording stage, if the tri-state buffer 66 becomes active in response to the rec/pb signal when the first FIFO 52 becomes inactive, the tri-state buffer 67 becomes active in response to the fifo_a_oe2 signal as shown in FIG. 10(e); and when the second FIFO 53 becomes inactive, the tri-state buffer 68 becomes active in response to the fifo_b_oe2 signal as shown in FIG. 10(f). During the reproduction stage, if the tri-state buffer 66 becomes inactive in response to the rec/pb signal when the first FIFO 52 becomes inactive, the tri-state buffer 64 becomes active in response to the fifo_a_oe1 as shown in FIG. 10(c); and when the second FIFO 53 becomes inactive, the tri-state buffer 65 becomes active in response to the fifo_b_oe1 signal as shown in FIG. 10(d).

As discussed above, the second FIFO 53 conducts an alternative process for a next packet received. Thus, when the second FIFO 53 becomes inactive in response to the FIFO_B_enable signal as shown in FIG. 7(i), the time stamp generator and controller 51 in the interfacer 50 can access the second FIFO 53 and a time stamp packet and data provided through the time stamp generator and controller 51 are written on the second FIFO 53. Upon the completion of writing the packet, the time stamp generator and controller 51 activates the FIFO_B_enable signal giving the shuffle memory 56 a right of access to the second FIFO 53. During this period, the tri-state buffer 66 is activated by the rec/pb signal and the tri-state buffer 68 is activated by the enable signal fifo_b_oe2. Accordingly, the time stamp and the data from the time stamp generator and controller 51 are written on the second FIFO 53 through the tri-state buffer 66 and output through the tri-state buffer 68.

Therefore, while the interfacer 50 has access to the second FIFO 53 and writes the data and time stamps thereon, the memory controller 55 has access to the first FIFO 52 and reads the data from the first FIFO 52 to the smoothing buffer region 56-1 in the shuffle memory 56. Upon completion of writing all of 192 bytes of data, the memory controller 55 activates the FIFO_A_read_end signal as shown in FIG. 7(j), giving the interfacer 50 the right of access to the first FIFO 52.

Similarly, while the interfacer 50 has access to the first FIFO 52 and writes the data and time stamps thereon, the memory controller 55 has access to the second FIFO 53 and reads the data from the second FIFO 52 to smoothing buffer region 56-1 in the shuffle memory 56. Upon completion of writing all of the 192 bytes of data on the smoothing buffer region 56-1, the memory controller 55 activates a FIFO_B_read_end signal as shown in FIG. 7(k), giving the interfacer 50 the right of access to the second FIFO 53.

If a packet is received for witting on the second FIFO 53, but the FIFO_B_enable signal is active as shown in FIG. 7(k), i.e. the shuffle memory 65 has not yet output data due to an overflow as shown in FIG. 7(f), the packet cannot be written on the second FIFO 53, resulting in a loss of data. When the data reception rate is higher than the data recording rate, an overflow occurs in the smoothing buffer, resulting the data loss.

Upon repeating the aforementioned process, the received MPEG2 transport packet data and its time stamps can be written on the smoothing buffer region 56-1 in the shuffle memory 56. The FIFO R/W control pulse generator 63 generates the read and write pulses, ff_a_rd, ff_a_wr, ff_b_rd, and ff_b_wr, for the first and second FIFOs 52 and 53.

The shuffle memory 56 according to the present invention is divided into a buffer region 56-1 for smoothing/desmoothing, a memory bank0 56-2, and a memory bank1 56-3. The buffer region 56-1 is allocated in a surplus region of the shuffle memory 56 while the bank0 56-2 and the bank1 56-3 have one block each adapted for alternate error correction. Particularly, if the bank0 56-2 is used for an inner error correction of a data, the bank1 is used for an outer error correction for a data, and vice versa. Accordingly, the data stored in the first, or second FIFO 52 or 53 is timely recorded on the smoothing buffer region 56-1 according to an appropriate timing calculated in the memory controller 55.

If the interfacer 50 activates the a FIFO_A_enable signal, the memory controller 55 has access to the data recorded on the second FIFO 53 and reads the data onto the smooth buffer region 56-1. Upon recording all the packet data on the smooth buffer region 56-1, the memory controller 55 activates a FIFO_B_read_end signal which gives the interfacer a right to access the second FIFO 53. In return, the interfacer 50 inactivates the FIFO_B_enable signal and outputs the signal to the memory controller 55.

The data stored in either bank0 56-1 or bank1 56-3 has its outer code word output to an outer ECC 57-1 in an ECC 57 for an outer error correction. Upon an addition of the outer code, the data with the outer code is stored in a pertinent location within the bank0 56-2 or bank1 56-3 through the memory controller 55. When the outer ECC is completed, an inner code word from either the bank0 56-2 or the bank1 56-3 is output to an inner ECC 57-2 for an inner error correction. However, since the inner code word is output to the inner ECC 57-2 after the completion of the outer ECC, when the inner code is incorporated in the ECC 57-2, the data is ready to be recorded on a tape. Thus, it is unnecessary to store the data back in bank memory of the shuffle memory 56. Accordingly, under the control of the memory controller 55, the data output by the smooth buffer region 56-1 is stored in the region of the shuffle memory 56 from which the inner code word had been output.

For example, if bank0 56-2 is engaged for an outer ECC, the bank0 56-2 outputs an outer code word 'c' to the outer ECC 57-1. After the completion of the outer ECC, the outer code incorporated data 'd' is stored back into the appropriate memory location of the bank0 56-2. Upon the completion of the outer ECC, the bank1 56-3 outputs an inner code word 'e' to the inner ECC 57-2 and a data 'b' from the smooth buffer 56-1 is stored in the location from which the inner code word has been output. Once the inner code word is output to the ECC 57-2, the bank1 stores only a null data together with the data from the smooth buffer 56-1. Hence, the bank1 outputs the outer code of the data received from the smooth buffer 56-1 to the ECC 57-1 for outer ECC and stores back the outer code incorporated data in the appropriate memory location. Alternatively, since the bank0 56-2 will be engaged for an inner ECC, the data from the smooth buffer region 56-1 is stored at a location in the bank0 from which the inner code has been output.

Also, similar to the related art, a null data is inserted into bank0 56-2 or bank1 56-3 of the shuffle memory 56 if there is no data from the digital TV while the memory controller 55 generates a read signal to the smooth buffer region 56-1. The data processed through the outer and inner ECC is read from either the bank0 56-2 or the bank1 56-3. A sync signal and an ID is added to the read data in the sync/ID adder 27 and the data is arranged into a synchronous block of a DVCR recording format. The synchronous block data is multiplexed with a subcode data to form one track of data before being recorded on the tape 30 through the NRZI 28 and the recording amplifier 29.

Figure 1:
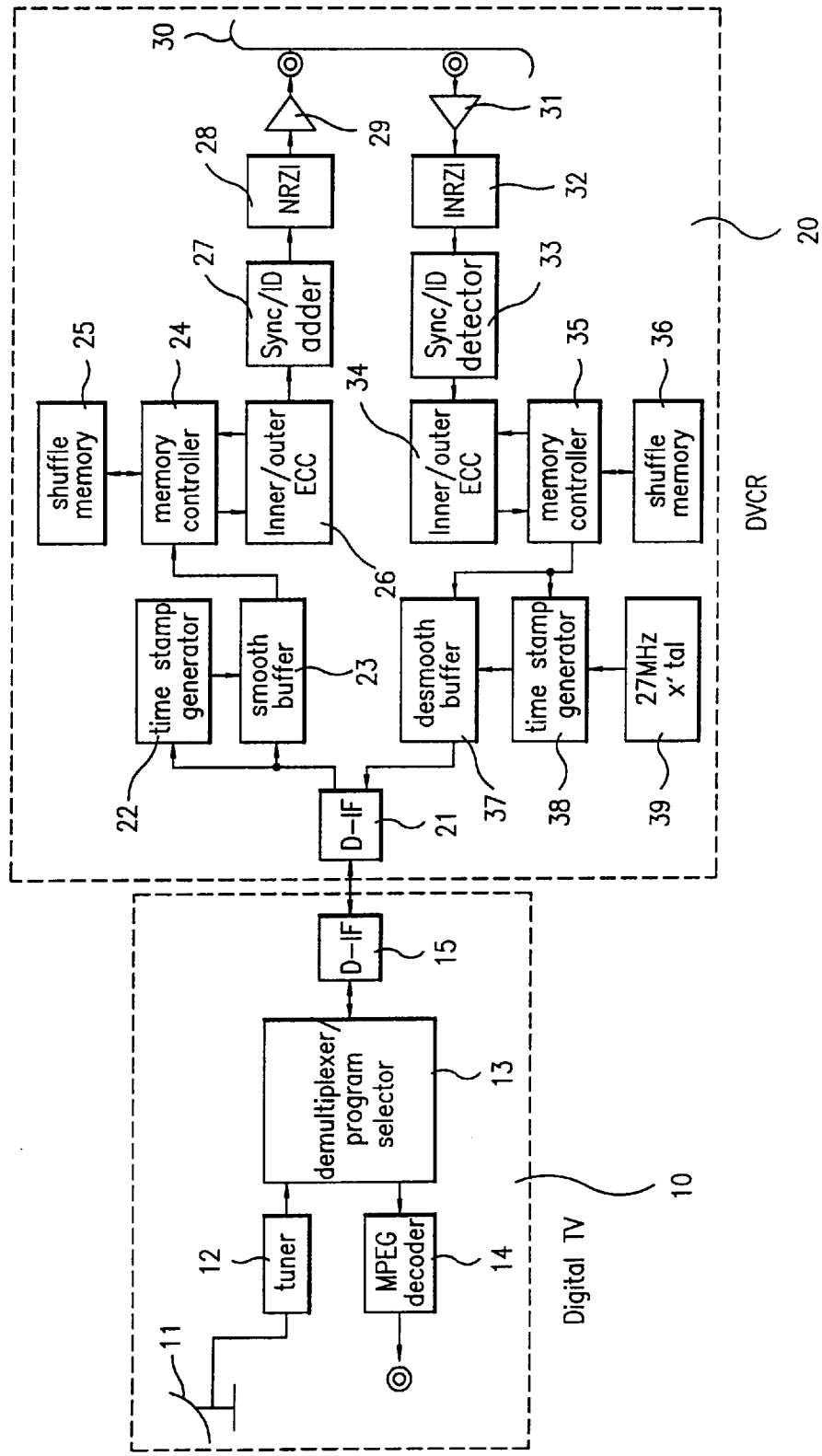
FIG. 1 illustrates a block diagram of a digital TV and DVCR in the background art.
Figure 2:
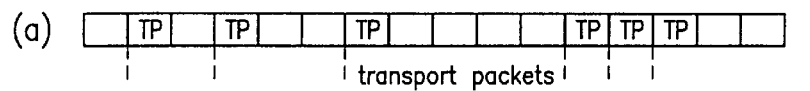
FIGS. 2a~2i illustrate an operation timing diagram of the different parts in FIG. 1.
Figure 2:
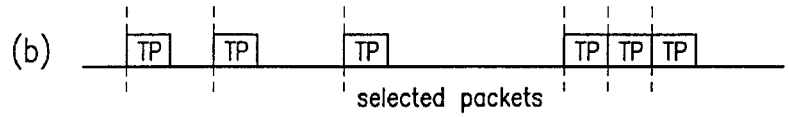
Figure 2:
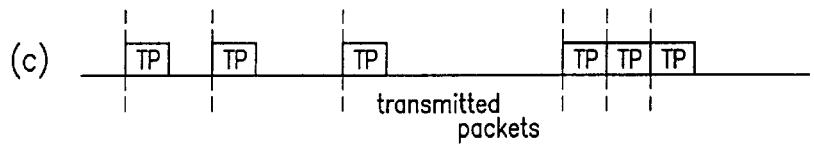
Figure 2:
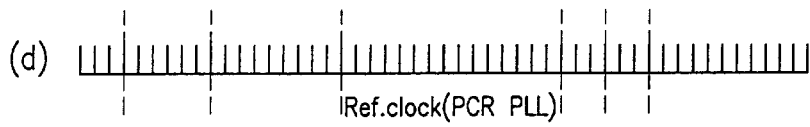
Figure 2:
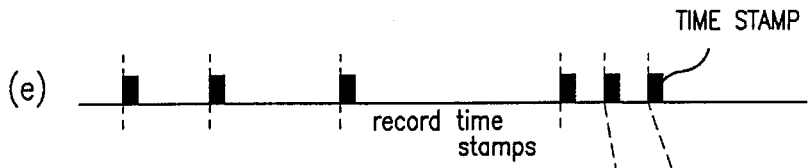
Figure 2:
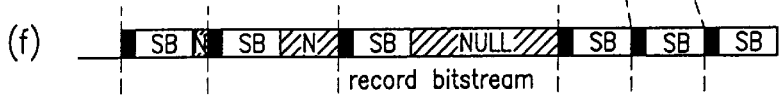
Figure 2:
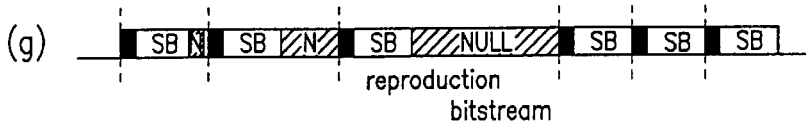
Figure 2:
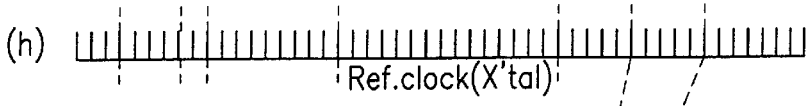
Figure 2:
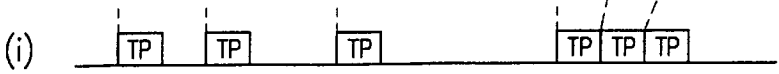
Figure 3:
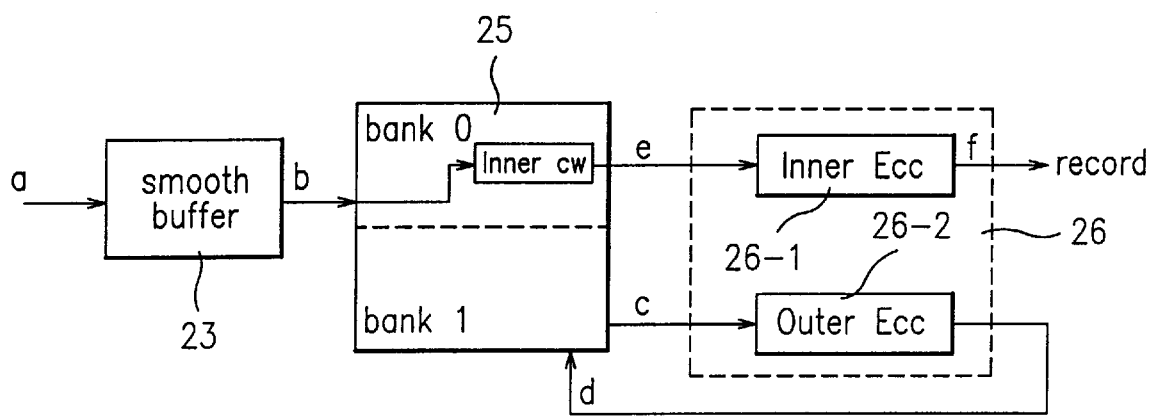
FIG. 3 is a block diagram showing the operation of the smooth buffer and the shuffle memory.
Figure 4:
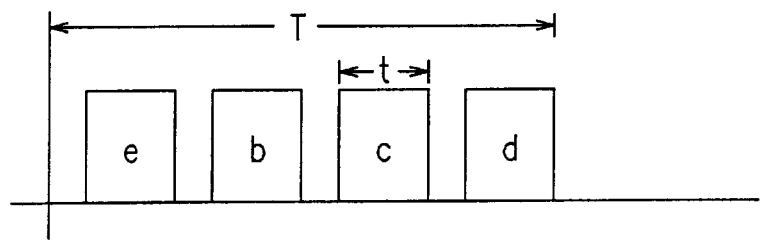
FIG. 4 illustrate an operation timing diagram of the parts shown in FIG. 3.
Figure 8:
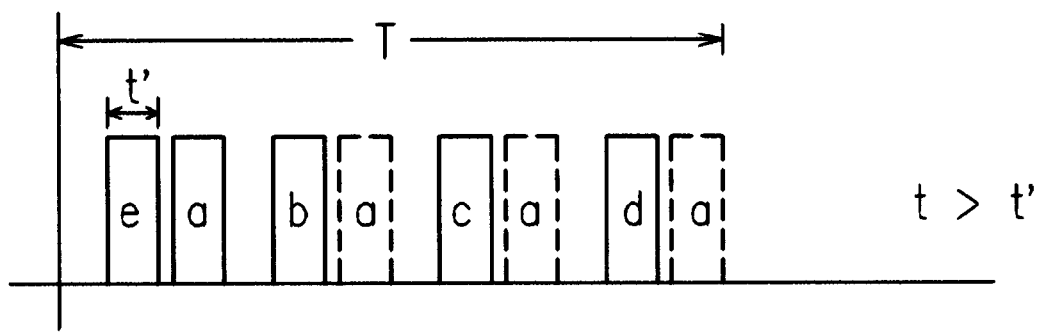
FIG. 8 illustrates an operation timing diagram of the shuffle memory in FIG. 5.

Because a smooth buffer, separate from the shuffle memory is employed, a parallel clock was adequate in the related art for the shuffle memory to sequentially process an inner ECC, the data from the smooth buffer, and an outer ECC in a time period T as shown in FIG. 4. However, the smooth buffer 56-1 of the present invention is within the shuffle memory 56. As a result, the shuffle memory 56 processes the data, i.e. an inner ECC, the storage of data from the smooth buffer, an outer ECC together with recording the data on the smooth buffer 56-1, within a time period T as shown in FIG. 8.

The interfacer 50 and the memory 55 generate and output the FIFO_A_enable, FIFO_A_read_end, FIFO_B_enable, FIFO_B_read_end signals when there is no overflow in the smooth buffer during a recording of an entire data packet on either the first or second FIFO 52, 53. Because the recording of the data is in response to the control signals output when there is no overflow, the data can be recorded on the smooth buffer 56-1 randomly at any time during the aforementioned process, i.e. the inner ECC, the storage of data from the smooth buffer 56-1, or the outer ECC. Accordingly, it is necessary to control the recording of the data on the smooth buffer 56-1 so that the recording and the other process do not interfere. Thus, the memory controller 55 controls the inner ECC, the storage of data from the smooth buffer 56-1, the outer ECC, and the data recording on the smooth buffer 56-1, by a means of a serial clock, not by the parallel clock as in the related art.

By utilizing the serial clock, the data 'b', 'c', 'd', and 'e' are processed much quicker such that there is ample time left over for the recording of the data on the smooth buffer 56-1 at any time. Specifically, the processing time period t' for each process using a serial clock according to the present embodiment is shorter than the processing time period t using a parallel clock according to the related art (t>t'). Thus, under the control of the memory controller 55, the shuffle memory 56 can carry out the inner ECC, the storage of data from the smooth buffer 56-1, the outer ECC, and the data recording on the smooth buffer 56-1 within the time period T without any collision.

As in the related art, the reproduction process is an opposite process to the recording process. FIGS. 9(*a*)–(*l*) illustrate a timing diagram of the control signals in the interfacer during reproduction. When a user selects reproduction during the state of digital power on as shown in FIG. 9(*a*), a control pulse generator (not shown) generates and outputs a servo reference (servo_ref) signal at $\frac{1}{60}$ sec. intervals as shown in FIG. 9(*c*) to a syscon (not shown), the syscon generates a head switching (head_sw) pulse locked to the servo_ref signal, and the time stamp and control pulse generator 62 receives the head_sw pulse. Also, the time stamp and control pulse generator 62 initialize all ICs into a reproducing mode in response to a user_pb signal as shown in FIG. 9(*b*) and enables a reproduction signal pb_en. When the pb_en signal is enabled, a pb_start signal as shown in FIG. 9(*d*) is generated in sync with the servo_ref signal.

In response to the pb_start signal, the reproduction process is initiated. After the reproduction process is initiated, at the moment the shuffle begins, the memory controller 55 receives a pb_ts_rst signal as shown in FIG. 9(*f*) from the time stamp and control pulse generator 62 and resets the forward bits of a time stamp counter. Concurrently, a pb_action signal as shown in FIG. 9(*e*) is also activated by which the interfacer 50 starts the reproducing mode.

As discussed above, all ICs and FIFO are initialized, specifically in response to the reset signal from the system control and the reproduction signal user b. After the initialization, the signal reproduced from the tape 30 is output to the sync/ID detector 33 through a reproduction amplifier 31 and the INRZI 32. The sync/ID detector 33 detects the sync signal and the ID to separate the subcode data from the main data.

The main data is first processed through an inner error correction decoding in the inner FCC 57-2 within the ECC 57 and under the control of the memory controller 55, the main data is stored in either bank0 56-2 or bank1 56-3 in the shuffle memory 56. While one bank is engaged in the inner error correction decoding, the other bank is available for an outer error correction decoding. Accordingly, upon the completion of the outer error correction decoding, the data is stored in a desmooth buffer region 56-1 in the shuffle memory 56 and transferred to either the first FIFO 52 or the second FIFO 53. Because the data is transferred to one of the FIFOs, it is unnecessary to store the data back into the memory bank of the shuffle memory 56. Thus, the data for the inner error correction decoding is stored in the location of the memory bank within the shuffle memory 56 from which the previous data has been output after completion of the outer error correction decoding. When, the data is fully written in the memory bank for the inner error correction decoding, the banks are switched to repeat the inner and outer error correction decoding according to the foregoing process.

To alternate the use of the memory banks for the inner and outer error correction decoding, control signals such as a FIFO_A_enable, a FIFO_B_enable, a FIFO_A_write_end, and a FIFO_B_write_end are used as control signals. If the FIFO_A_enable signal as shown in FIG. 9(*g*) or the FIFO_B_enable signal as shown in FIG. 9(*j*) is in an active state, only the shuffle memory 56 has the right of access to the first and second FIFOs 52 and 53. Accordingly, during the initial stage of reproduction, the FIFO_A_enable signal and the FIFO_B_enable signal are activated.

If the first FIFO 52 is active, the data written on the desmooth buffer region 56-1 in the shuffle memory 56 is written on the first FIFO 52 through the tri-state buffer 64. When an entire packet data is written on the first FIFO 52, the memory controller 55 activates the FIFO_A write end signal. The FIFO_A_write_end signal inactivates the FIFO_A_enable signal, by which the right of access to the first FIFO 52 is passed to the time stamp generator and controller 51 within the interfacer 50 FIFO 52 for a time stamp reading.

The time stamp generator and controller 51 separates the time stamp signals from the received data ff_q[0:15]. By comparing the separated time stamps to the time stamps generated at 27 MHz for reproduction, the rest of the 188 bytes of the MPEG 2 transport packets are output to the D-1F 21 at the exact point in time when the time stamps coincide. Also during the output, the null data inserted during the recording stage is removed by skipping the null data.

While the time stamp generator and controller 51 has access to the first FIFO 52, the memory controller 55 has access to the second FIFO 53 to write the data from the desmooth buffer region 56-1 of the shuffle memory 56 on the second FIFO 53 through the tri-state buffer 65. However, if the FIFO_B_enable signal is inactive, i.e. the data in the second FIFO 53 has not been output by the interfacer 50, the data is stored in the desmooth buffer 56-1. The data is stored in the desmooth buffer 56-1 until the FIFO_B_enable data is activated, upon which the data stored in the desmooth buffer 56-1 is output to the second FIFO 53.

By repeating the foregoing process of utilizing the time stamps, the received MPEG2 transport packet data can be output to the D-IF 21. The FIFO R/W control pulse generator 63 generates the read and write pulses for the first and second FIFOs 52 and 53 to output the data. At this point, the tri-state buffer 66 is inactivated by the rec/pb signal. Thus, the data passing through the tri-state buffer 64 or the tri-state buffer 65 is not output back to the time stamp generator and controller 51 through the tri-state buffer 66. Also, during reproduction, the tri-state buffer 64 and the tri-state buffer 65 is alternately activated in response to an enable signal fifo_b_oe1 and an enable signal fifo_b_oe1, respectively. The tri-state buffer 67 and the tri-state buffer 68 are however inactivated by an enable signal fifo_a_oe2 and an enable signal fifo_b_oe2 respectively, such that the data from the first and second FIFOs 52 and 53 is not output back to the shuffle memory 55.

Because the data bus da_ird[0:15] of the shuffle memory 56 serves both to read for recording and to write for reproduction, the five tri-state buffers 64–68 and the control signals rec/pb, fifo_a_oe1, fifo_a_oe2, fifo_b_oe1, and fifo_b_oe2 are used. Accordingly, by receiving/forwarding MPEG 2 transport packets in the same timing in recording/reproduction using the aforementioned process, the limitation on the MPEG 2 timing jitter is satisfied.

In sum, the method and apparatus for controlling a memory according to the present invention lowers the system cost by allocating a memory for smoothing/desmoothing to a surplus portion of an existing shuffle memory. Also, the present invention allows the shuffle memory to efficiently process the data using a serial clock such that the inner ECC, the storage of data from the smooth buffer, the outer ECC, and the data recording on the smooth buffer are completed within a shorter time period without interference from one another. Moreover, by sharing the data bus of a shuffle memory with the interfacer using a plurality of tri-state buffers and control signals, additional logics are reduced, such as bus lines and multiplexers. Finally, a collision of data received at variable rates is prevented by effecctively using the FIFOs.

The foregoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method for reproducing digital data in a recording and reproduction device having a shuffle memory with a plurality of regions receiving data with a plurality of transfer packets from a recording medium, comprising the steps of:

allocating a desmoothing memory region to a surplus region of the shuffle memory;

alternating between two processes in which said one process stores a first transfer packet in one region of the shuffle memory for inner error correction decoding, and said other process stores a second transfer packet in a second region of the shuffle memory for an outer error correction decoding after said second transfer packet has completed an inner error correction decoding; and temporarily outputting and storing said second transfer packet upon completion of the outer error correction decoding in said desmoothing memory region.

2. A method of claim 1, further comprising the step of:

storing a third transfer packet in a location from which the second transfer packet has been output upon completion of the outer error correction decoding.

3. A method of claim 1, wherein the steps are carried out synchronized to a serial clock.

4. A digital recording device for recording a digital data to reproduce the digital data at a fixed rate, comprising:

an interfacer receiving the digital data with transport packets, generating time stamps in the received data to denote the data reception time, and temporarily storing the time stamped data before outputting the time stamped data;

an ECC for processing an outer code word ECC and an inner code word ECC;

a shuffle memory divided into a plurality of regions,
      wherein a first region receives and stores the time stamped data before timely transferring the data to a second region of the shuffle memory, and
      wherein said second region receives the data from said first region and transfers the data to and from said ECC to process an outer code word ECC and an inner code word ECC, said second region outputs the data at a fixed rate upon completion of the inner code word ECC.

5. A device of claim 4, further comprising:

a memory controller utilizing a serial clock to control the reading of the time stamped data from said interfacer to said first region of the shuffle memory, and the data transfer between said first region of the shuffle memory and said second region of the shuffle memory.

6. A device of claim 5, wherein said first region of the shuffle memory is a smooth buffer and said second region of the shuffle memory is further divided into a first bank and a second bank.

7. A device as claimed in claim 5, wherein said interfacer comprises:

a time stamp generator and controller generating a time stamp in the received data denoting the data reception time and generating a plurality of control signals, a first FIFO temporary storing and outputting the time stamped data;

a second FIFO temporary storing and outputting the time stamped data; and wherein said first and second FIFOs alternatingly store and output said time stamped data in response to said plurality of control signal generated by said time stamp generator and controller.

8. A device of claim 7, wherein said time stamp generator and controller includes:
an MPEG2 interface/frame receiving a starting signal of the transport packets and data to be recorded;
a time stamp and control pulse generator generating the time stamp counted at a frequency in response to said starting signal received from said MPEG2 interface/frame and a control signal from a user selecting recording, and
a FIFO R/W control pulse generator generating read/write signals for said first and second FIFOs to alternate the storage and output of said time stamped data.

9. A device of claim 7, wherein:
said first and second FIFOs each have an input terminal and an output terminal connectedto a first plurality of buffers; and
said time stamp generator and controller has an output terminal connected to a second buffer which is also connected to the input terminal of said first and second FIFOs.

10. A device of claim 9, wherein each of said first plurality of buffers and said second buffer is a tri-state buffer, operative as a transceiver when an output enable is active, when the output enable is inactive, and when an output terminal has a high impedance.

11. A device of claim 7, wherein said time stamp generator and controller generates and outputs to said memory controller:
a first control signal having an active and inactive state, said first control signal activated by said time stamp generator and controller giving said shuffle memory the access to said first FIFO, and said first control signal in an inactive state giving said time stamp generator and controller the access to said first FIFO; and
a second control signal having an active and inactive state, said first control signal activated by said time stamp generator and controller giving said shuffle memory the access to said second FIFO, and said second control signal in an inactive state giving said time stamp generator and controller the access to said second FIFO.

12. A device of claim 11, wherein said shuffle memory has access to said first FIFO while said time stamp generator and controller has access to said second FIFO, and said shuffle memory has access to said second FIFO while said time stamp generator and controller has access to said first FIFO.

13. A device of claim 12, wherein if said shuffle memory has access to said first FIFO, said time stamp generator and controller has access to said second FIFO and:
said shuffle memory having access to said first FIFO reads the time stamped data from said first FIFO and writes the data on said first region of the shuffle memory;
said time stamp generator and controller having access to said second FIFO writes the time stamped data on said second FIFO; and
upon completion of writing an entire transport packet of the time stamped data on said first region, the time stamp generator and controller receives the right of access to the first FIFO and the shuffle memory receives the right of access to the second FIFO.

14. A device of claim 12, wherein if said shuffle memory has access to said second FIFO, said time stamp generator and controller has access to said first FIFO and:
said shuffle memory having access to said second FIFO reads the time stamped data from said second FIFO and writes the data on said first region of the shuffle memory;
said time stamp generator and controller having access to said first FIFO writes the time stamped data on said first FIFO; and
upon completion of writing an entire transport packet of the time stamped data on said first region, the time stamp generator and controller receives the right of access to the second FIFO and the shuffle memory receives the right of access to the first FIFO.

15. A device of claim 12, wherein;
said first and second FIFOs each have an input terminal and an output terminal connected to a first plurality of buffers; and
said time stamp generator and controller has an output terminal connected to a second buffer which is also connected to the input terminal of said first and second FIFOs.

16. A device of claim 15, wherein if said time stamp generator and controller has access to said first FIFO, said second buffer is at active while said first plurality of buffers are inactive, and the time stamped data is read from said time stamp generator and controller onto said first FIFO through the fifth buffer.

17. A device of claim 15, wherein if said time stamp generator and controller has access to said second FIFO, said second buffer is at active while said first plurality of buffers are inactive, and the time stamped data is read from said time stamp generator and controller onto said second FIFO through the fifth buffer.

18. A device of claim 15, wherein if said shuffle memory has access to said first FIFO, said second buffer and a buffer connected to the output terminal of said first FIFO are active, and the time stamped data is read from the first FIFO onto said second region in the shuffle memory through the buffer connected to the output terminal of said first FIFO.

19. A device of claim 15, wherein, if said shuffle memory has access to said second FIFO, said second buffer, a buffer connected to the input terminal of said first FIFO and a buffer connected to the output terminal of said second FIFO are active, and the time stamped data is read from the first FIFO onto said second region in the shuffle memory through the buffer connected to the output terminal of said second FIFO.

20. A device of claim 7, wherein said first and second FIFOs are allocated from a single FIFO.

21. A digital reproduction device for reproducing digital time stamped data recorded at a fixed rate, comprising:
an ECC to process a data reproduced from a recording medium for an inner error correction decoding and an outer error correction decoding;
a shuffle memory having a plurality of memory banks and a desmoothing buffer region allocated to a surplus region of said shuffle memory; said plurality of memory banks storing an inner error correction decoded data from said ECC and outputting an outer error correction decoded data from said ECC to said desmoothing buffer region;
a memory controller timely controlling the storage of inner error correction decoded data in said plurality of memory banks and the outputting of the outer error decoded data to said desmoothing buffer region by means of a serial clock; and,
an interfacer temporary storing the data from the desmoothing buffer region of the shuffle memory and timely outputting the data according to a prescribed frequency.

22. A device of claim 21, wherein the interfacer includes:
- a first FIFO temporarily storing the data from the desmoothing buffer region in the shuffle memory,
- a second FIFO temporarily storing the data from the desmoothing buffer region in the shuffle memory, and
- a time stamp generator and controller reading the data from the first or second FIFO, separating a time stamp from the data, and comparing the separated time stamp to a time stamp generated at a prescribed frequency; said time stamp generater and controller outputting the data at a moment the two time stamps coincide, wherein said first FIFO and said second FIFO are controlled to alternately write and read the data under the control of said memory controller.

23. A device of claim 22, wherein:
- said first and second FIFOs each have an input terminal and an output terminal connected to a first plurality of buffers; and
- said time stamp generator and controller has an output terminal connected to a second buffer which is also connected to the input terminal of said first and second FIFOs.

24. A device of claim 23, wherein each of said first plurality of buffers and said second buffer is a tri-state buffer, operative as a transceiver when an output enable is active, when the output enable is inactive, and when an output terminal has a high impedance.

25. A device of claim 23, wherein said time stamp generator and controller generates and outputs to said memory controller:
- a first control signal having an active and inactive state, said first control signal activated by said time stamp generator and controller giving said shuffle memory the access to said first FIFO, and said first control signal in an inactive state giving said time stamp generator and controller the access to said first FIFO; and
- a second control signal having an active and inactive state, said first control signal activated by said time stamp generator and controller giving said shuffle memory the access to said second FIFO, and said second control signal in an inactive state giving said time stamp generator and controller the access to said second FIFO.

26. A device of claim 25, wherein said shuffle memory has access to said first FIFO while said time stamp generator and controller has access to said second FIFO, and said shuffle memory has access to said second FIFO while said time stamp generator and controller has access to said first FIFO.

27. A device of claim 25, wherein if the shuffle memory has the right of access to said first FIFO, the buffer connected to input terminal of said first FIFO is active, and the data is written from said desmoothing memory region on the first FIFO through said buffer connected to the input terminal of said first FIFO, and when an entire transport packet of data written, the time stamp generator and controller has the right of access to said first FIFO under the control of the memory controller.

28. A device of claim 25, wherein if the time stamp generator and controller has the right of access to said first FIFO, the time stamp generator and controller reads the data from said first FIFO, separates a time stamp, compares the time stamp to a time stamp generated at a prescribed frequency, and outputs the data any time except at a moment said two time stamps coincide.

29. A device of claim 25, wherein if the shuffle memory has the right of access to the second FIFO, the buffer connected to the input terminal of said second FIFO is active, and the data is written from said desmoothing memory region on the second FIFO through said buffer connected to the input terminal of said second FIFO, and when an entire transport packet of data written, the time stamp generator and controller has the right of access to said second FIFO under the control of the memory controller.

30. A device as claimed in claim 22, wherein if the time stamp generator and controller has the right of access to said second FIFO, the time stamp generator and controller reads the data from said second FIFO, separates a time stamp, compares the time stamp to a time stamp generated at a prescribed frequency, and outputs the data any time except at a moment said two time stamps coincide.

* * * * *